United States Patent
Rhee et al.

(10) Patent No.: US 7,197,102 B2
(45) Date of Patent: Mar. 27, 2007

(54) METHOD AND APPARATUS FOR CLOCK-AND-DATA RECOVERY USING A SECONDARY DELAY-LOCKED LOOP

(75) Inventors: Woogeun Rhee, Nanuet, NY (US); Daniel Friedman, Sleepy Hollow, NY (US); Sudhir Gowda, Briarcliff Manor, NY (US); Mehmet Soyuer, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 928 days.

(21) Appl. No.: 10/163,340

(22) Filed: Jun. 7, 2002

(65) Prior Publication Data

US 2003/0227989 A1     Dec. 11, 2003

(51) Int. Cl.
H03D 3/24 (2006.01)
H04L 7/00 (2006.01)

(52) U.S. Cl. ........................ 375/376; 375/355
(58) Field of Classification Search ............... 375/354, 375/355, 371, 373, 376
See application file for complete search history.

(56) References Cited

U.S. PATENT DOCUMENTS

| | | | |
|---|---|---|---|
| 4,590,602 A * | 5/1986 | Wolaver | 375/375 |
| 5,301,196 A * | 4/1994 | Ewen et al. | 370/518 |
| 5,727,037 A * | 3/1998 | Maneatis | 375/376 |
| 5,736,961 A | 4/1998 | Fenton et al. | |
| 6,028,903 A * | 2/2000 | Drost et al. | 375/360 |
| 6,057,739 A * | 5/2000 | Crowley et al. | 331/14 |
| 6,100,722 A * | 8/2000 | Dalmia | 327/12 |
| 6,252,443 B1 * | 6/2001 | Dortu et al. | 327/156 |
| 6,288,589 B1 * | 9/2001 | Potter et al. | 327/295 |
| 6,476,653 B1 * | 11/2002 | Matsuzaki | 327/158 |
| 6,822,483 B1 * | 11/2004 | Fu et al. | 327/2 |
| 6,910,144 B2 * | 6/2005 | Ehlert et al. | 713/400 |
| 2002/0075981 A1 * | 6/2002 | Tang et al. | 375/372 |

OTHER PUBLICATIONS

Daniel Friedman et al., Sub-Picosecond Jitter SiGe BiCMOS Transmit and Receive PLLs for 12.5 Gbaud Serial Data Communication, Jan. 5, 2000.

Tobias Ellermeyer, Ulrich Langmann, Berthold Wedding, Wolfgang Pojlmann, A 10Gb/s Eye Opening Monitor IC for Decision-Guided Optimization of the Frequency Response of an Optical Receiver, Feb. 7, 2000, pp. 50-51 of ISSCC 2000/Session 3/Gigabit-Rate Communications/Paper MP 3.1, 2 pages Total.

(Continued)

*Primary Examiner*—Jay K. Patel
*Assistant Examiner*—David B. Lugo
(74) *Attorney, Agent, or Firm*—Jesse L. Abzug, Esq.; McGinn IP Law Group, PLLC

(57) ABSTRACT

A clock and data recovery circuit includes a delay-locked-loop adapted to recover data from a data stream: and a phase-locked-loop in communication with the delay-locked-loop and adapted to recover a clock signal from the data stream.

18 Claims, 6 Drawing Sheets

OTHER PUBLICATIONS

Sang-Hyun Lee, Moon-Sang Hwang, Toungdon Choi, Sungjoon Kim, Yongsam Moon, Bong-Joon Lee, Deog-Kyoon Jeong, Wonchan Kim, Young June Park, Gi-Jung Ahn, A 5Gb/s 0.25 um CMOS Jitter-Tolerant Variable-Interval Oversampling Clock/Data Recovery Circuit, Feb. 5, 2002, pp. 256-257 of ISSCC 2002/Session 15/Gigabit Communications/15.5, 2 Pages Total.

M. Rau, T. Oberst, R. Lares, A. Rothermel, R. Schweer, N. Menoux, Clock/Data Recovery PLL Using Half-Frequency Clock, Jul. 1997, pp. 1156-1159 of IEEE Journal of Solid-State Circuits, vol. 32, No. 7, 4 Pages Total.

Evelina Yeung, Mark A. Horowitz, A 2.4 G b/s/pin Simultaneous Bidirectional Parallel Link With Per-Pin Skew Compensation, Nov. 2000, pp. 1619-1628 of IEEE Journal of Solid-State Circuits, vol. 35, No. 11, 10 Pages Total.

Sang-Hyun Lee et al., A 5Gb/s 0.25 um CMOS Jitter-Tolerant Variable-Interval Oversampling Clock/Data Recovery Ciruit, ISSCC 2002/Session 15/Gigabit Communications/15.5, pp. 56-58.

* cited by examiner

METHOD AND APPARATUS FOR CLOCK-AND-DATA RECOVERY USING A SECONDARY DELAY-LOCKED LOOP

BACKGROUND OF THE INVENTION

1. Field of the Invention

The present invention generally relates to clock-and-data recovery systems where a periodic clock signal is to be extracted from non-periodic data, and the same clock is then used to sample data with a minimum of errors.

2. Description of the Related Art

Phase-locked loop circuits play a critical role in high speed data communications. They are used in clock-and-data recovery circuits, in which clock and data are recovered from a single high-speed serial stream of non-return-to-zero data. Ethernet, Fibre Channel, and SONET/SDH transmission systems are specific examples of systems that typically use phase-locked loop-based clock-and-data recovery circuits.

FIG. 1 shows a block diagram of a conventional phase-locked loop-based clock-and-data recovery 10, which has a phase detector 12, a loop filter 14, and a voltage-controlled oscillator 16. The phase-locked loop-based clock-and-data recovers circuit 10 is connected to a D-type flip-flop 18. The phase detector 12 receives the clock data stream and the clock signal from the voltage-controlled oscillator 16, and compares the timing difference between the data transition in the data stream and the clock edge from the voltage-controlled oscillator 16. The phase detector 12 then generates an error voltage to tune the voltage-controlled oscillator frequency.

Conventional phase detectors 12 are usually also accompanied by a charge pump (not shown) in modern integrated circuit design. The loop filter 14 between the phase detector 12 and the voltage-controlled oscillator 16 rejects high frequency noise that is embedded in the incoming data.

The feedback operation shown in FIG. 1 forces the clock edge from the voltage-controlled oscillator to be aligned to the data transition in steady state, and the D-type flip-flop 18 samples the data with the recovered clock signal. To reduce the bit-error rate of the communications link, the data should be retimed in such a way that the clock edge that is used to sample data is aligned to the middle of the data bit period.

In clock-and-data recovery systems, noise is an overriding design concern. For a phase-locked loop, noise is quantified by measuring the jitter of the phase-locked loop output. For example, for SONET applications, the jitter transfer function is important and is required to have less than a 0.1 dB peaking at 3 dB corner frequency. Jitter peaking should be avoided when a phase-locked loop is used repeatedly, as in a SONET application, since it amplifies jitter at a certain frequency band where peaking occurs in jitter transfer function. The peaking at the 3 dB corner frequency usually happens if the loop dynamic of the phase-locked loop is not well designed, which is one of the reasons that prevent phase-locked loop bandwidth from being widened. Thus, to design a low-jitter phase-locked loop is challenging in many ways due to stringent jitter budgets and loop bandwidth specifications. The phase-locked loop in a clock-and-data recovery circuit provides three functions: (a) it filters out noise in the data channel: (b) it extracts clock information: and (c) it tracks the jitter of the data for better data retiming. Having the data sampled by a single D-type flip-flop, conventional phase-locked-loop based clock-and-data recovery circuits provide instant data retiming with the recovered clock signal.

To accommodate high-frequency timing variation of the data edge, the phase-locked loop needs to exhibit an agile response to track the short-term jitter using wide loop bandwidth. However, wide loop bandwidth can limit the noise-filtering from the data channel as the noise bandwidth increases. As the clock is perturbed by unwanted channel noise, the bit-error rate will increase simply due to the clock itself Therefore, there is a fundamental tradeoff in choosing loop bandwidth between the clock extraction and the data retiming.

SUMMARY OF THE INVENTION

In view of the foregoing and other problems, drawbacks, and disadvantages of the conventional methods and structures, an object of the present invention is to provide a method and structure in which a clock and data recovery circuit includes a delay-locked-loop adapted to recover data from a data stream and a phase-locked-loop in communication with the delay-locked-loop and adapted to recover a clock signal from the data stream.

An object of the present invention is to prevent perturbing the clock by unwanted channel noise.

In a first aspect of the present invention, a clock and data recovery circuit includes a delay-locked-loop adapted to recover data from a data stream: and a phase-locked-loop in communication with the delay-locked-loop and adapted to recover a clock signal from the data stream.

In a second aspect of the present invention, a method of recovering clock and data signals from a data stream, includes recovering data from said data stream in a delay-locked-loop: receiving said data stream in a phase-locked-loop from said delay-locked loop: and recovering a clock signal from said data stream in said phase-locked-loop.

In a third aspect of the present invention, a circuit for recovering clock and data signals from a data stream, includes means for extracting a clock signal from the data stream: and means for extracting data from a data stream, wherein the means for extracting said clock signal and the means for extracting data are independent to optimally allocate bandwidth.

In a fourth aspect of the present invention, a circuit for recovering clock and data signals from a data stream, includes means for recovering data from the data stream in a delay-locked-loop: means for receiving the data stream in a phase-locked-loop from the delay-locked loop: and means for recovering a clock signal from the data stream in the phase-locked-loop.

With the unique and unobvious aspects of the present invention, a two-part topology performs clock-and-data recovery operations in two steps. The topology employs a delay-locked loop to make the data retiming process independent of a clock signal recovery function, in which the clock signal is extracted from the data channel by a phase-locked loop. The phase-locked loop extracts the clock information from a noisy serial stream of non-return-to-zero data and tracks the long-term jitter, while a delay-locked loop having a wide loop bandwidth performs data synchronization in the phase domain and tracks the short-term jitter. The separation of these functions allows the designer to optimally allocate the loop bandwidth for each function.

With the present invention, one can provide a narrow or moderate bandwidth for the phase-locked loop for a clean clock signal and can provide a wide bandwidth for the delay-locked loop for prompt jitter tracking without creating jitter peaking. With the present invention, the jitter peaking can be avoided with wide loop bandwidth since the delay-locked loop (first order loop) does not create overshoot in a jitter transfer function. The present invention offers wider loop bandwidth than typical phase-locked loop clock-and-data recovery systems.

An embodiment of the present invention also offers a data-pattern-independent bang-bang phase detection when binary phase detectors are used.

The present invention also provides a solution for parallel link data communications based on clock signal recovery from a single channel, which avoids the use of multiple voltage-controlled oscillators.

The present invention is valuable in any number of applications such as, for example, Ethernet systems, local networks including optical networks and any serial (parallel) data network that has to be deserialized.

BRIEF DESCRIPTION OF THE DRAWINGS

The foregoing and other purposes, aspects and advantages will be better understood from the following detailed description of exemplary embodiments of the invention with reference to the drawings, in which.

DETAILED DESCRIPTION OF EXEMPLARY EMBODIMENTS OF THE INVENTION

Figure 1:
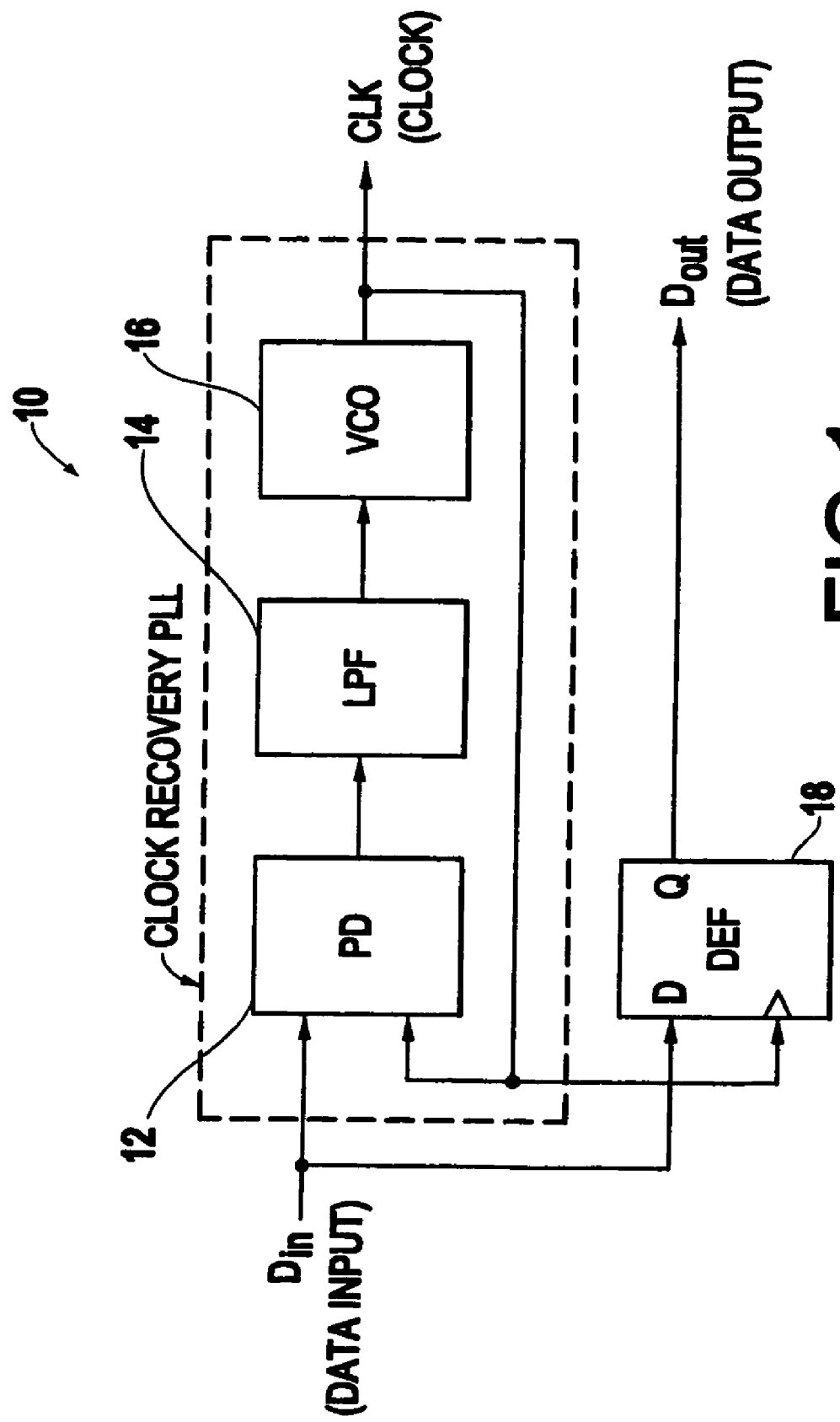
FIG. 1 is a block diagram of a conventional phase-locked loop-based clock-and-data recovery circuit.

Referring now to the drawings, and more particularly to FIGS. 2–7, there are shown exemplary embodiments of methods and structures according to the present invention.

Figure 2:
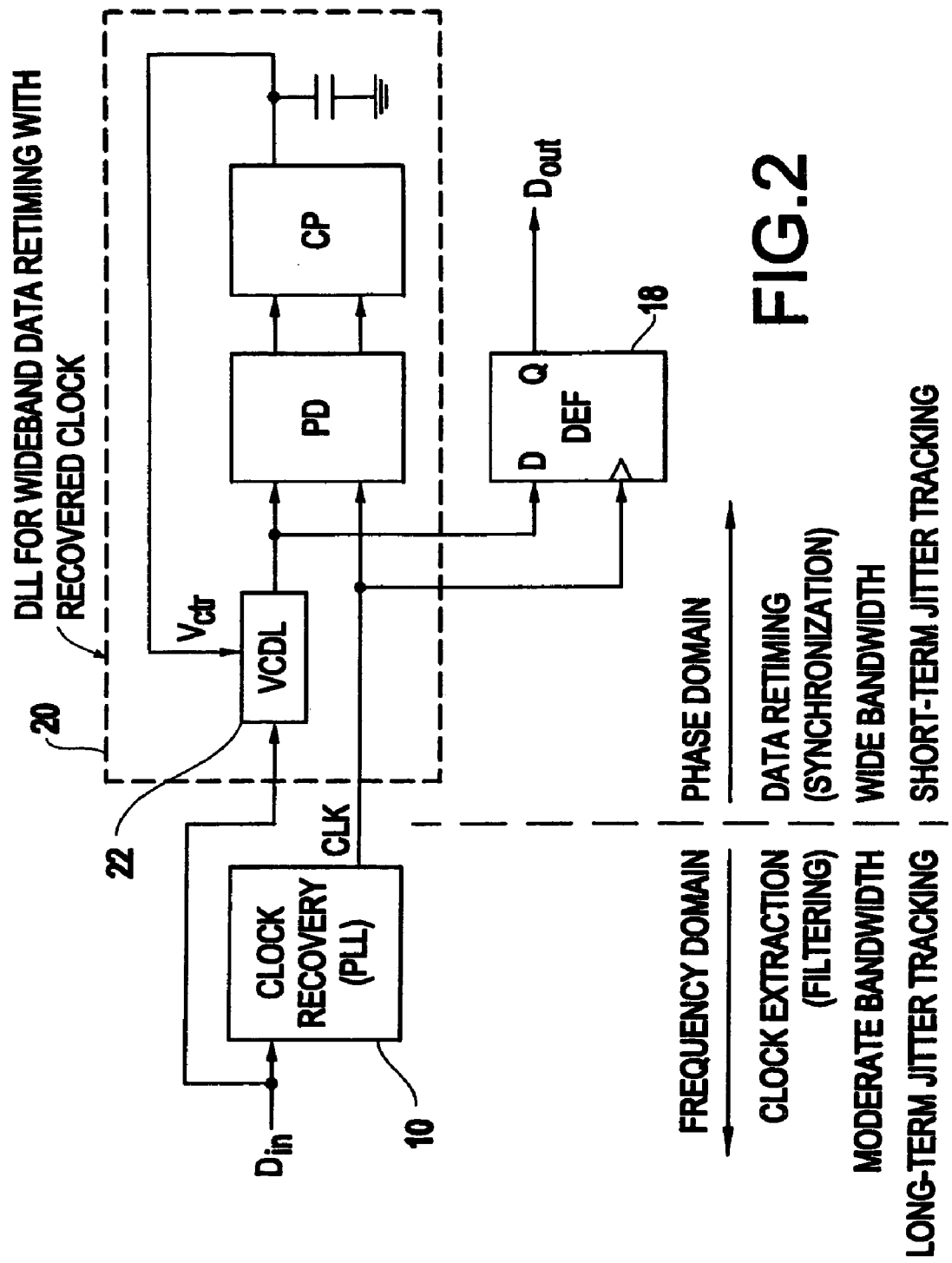
FIG. 2 is a block diagram of a first exemplary embodiment of a clock-and-data recovery circuit in accordance with the present invention.

The present invention provides a two-part topology for performing clock-and-data recovery operations. As shown in FIG. 2. the topology of a first exemplary embodiment of a clock-and-data recovery circuit of the present invention employs a delay-locked loop 20 with a self-calibrating voltage-controlled delay line 22 to make the data retiming process independent of the clock recovery function in which the clock is extracted from the data channel by a phase-locked loop 10. The phase-locked loop system 10 for clock recovery is the same as conventional systems as shown in FIG. 1.

However, for the exemplary embodiment of the present invention shown in FIG. 2, the phase-locked loop 10 extracts the clock information from a noisy serial stream of non-return-to-zero data and tracks the long-term jitter, while a delay-locked loop (DLL) 20 having wide loop bandwidth performs data synchronization in the phase domain and tracks the short-term jitter without creating jitter peaking. The separation of these functions allows the designer to optimally allocate loop bandwidth for each function. The optimized loop-bandwidth partition improves the overall clock-and-data recovery performance.

Since the delay-locked loop 20 automatically adjusts the phase skew which may be caused by the clock recovery loop, it can be physically separated from the phase-locked loop 10 for further isolation. For example, the delay-locked loop 20 can be located close to digital circuits like a demultiplexer (not shown), rather than adjacent to sensitive analog circuits like the voltage-controlled oscillator shown in FIG. 1.

Figure 3:
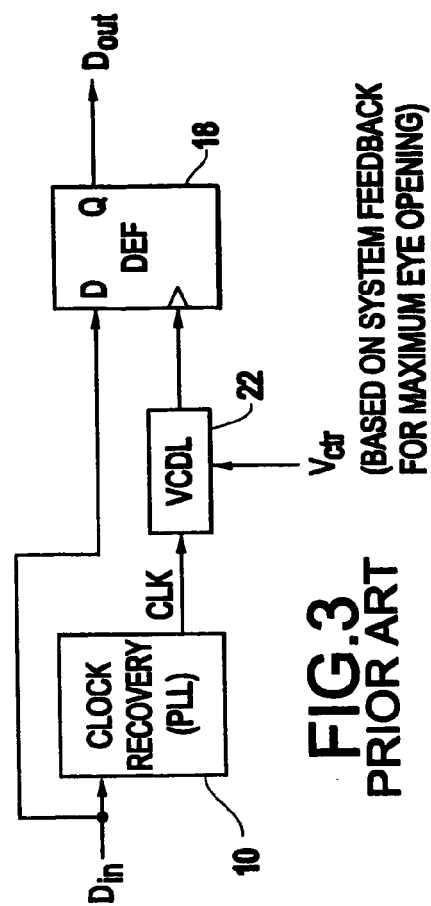
FIG. 3 is a block diagram of a conventional way of using a delay line for phase adjustment.

FIG. 3 shows a conventional way of using a voltage-controlled delay line for phase adjustment. The control input (Vctr) of the voltage-controlled delay line 22 is based on system feedback to maximize the eye opening. In contrast to the present invention, the system shown in FIG. 3 should use a narrowband feedback system to control the static phase offset, so that the feedback system does not degrade jitter transfer performance. In other words, it optimizes the overall bit-error rate with the voltage-controlled delay line 22, but it does not control the clock-and-data recovery performance metrics in terms of jitter generation, jitter transfer, and jitter tolerance as the present invention.

Second Exemplary Embodiment

Figure 4:
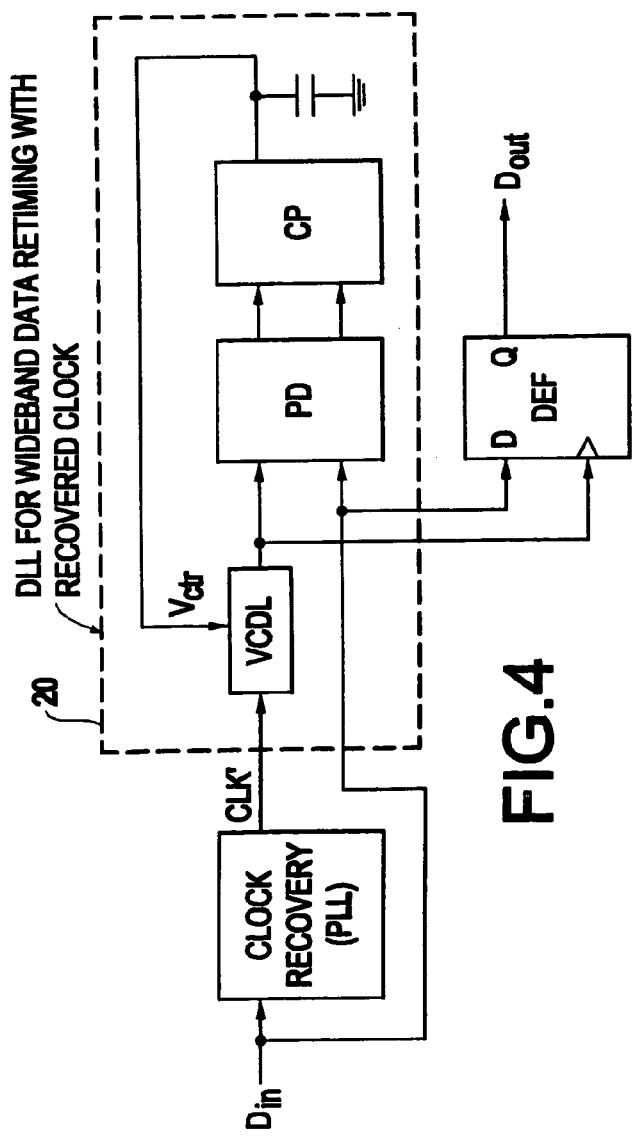
FIG. 4 is a block diagram of a second exemplary embodiment of a clock-and-data recovery circuit in accordance with the present invention.

When only data synchronization is required without jitter transfer consideration, an alternative way to implement the delay-locked loop 20 in accordance with a second exemplary embodiment of a clock-and-data recovery circuit of the present invention is to delay the clock instead of the data, as shown in FIG. 4. This embodiment offers simpler implementation since delaying the clock does not demand group-delay consideration in voltage-controlled delay line design.

Third Exemplary Embodiment

Figure 5:
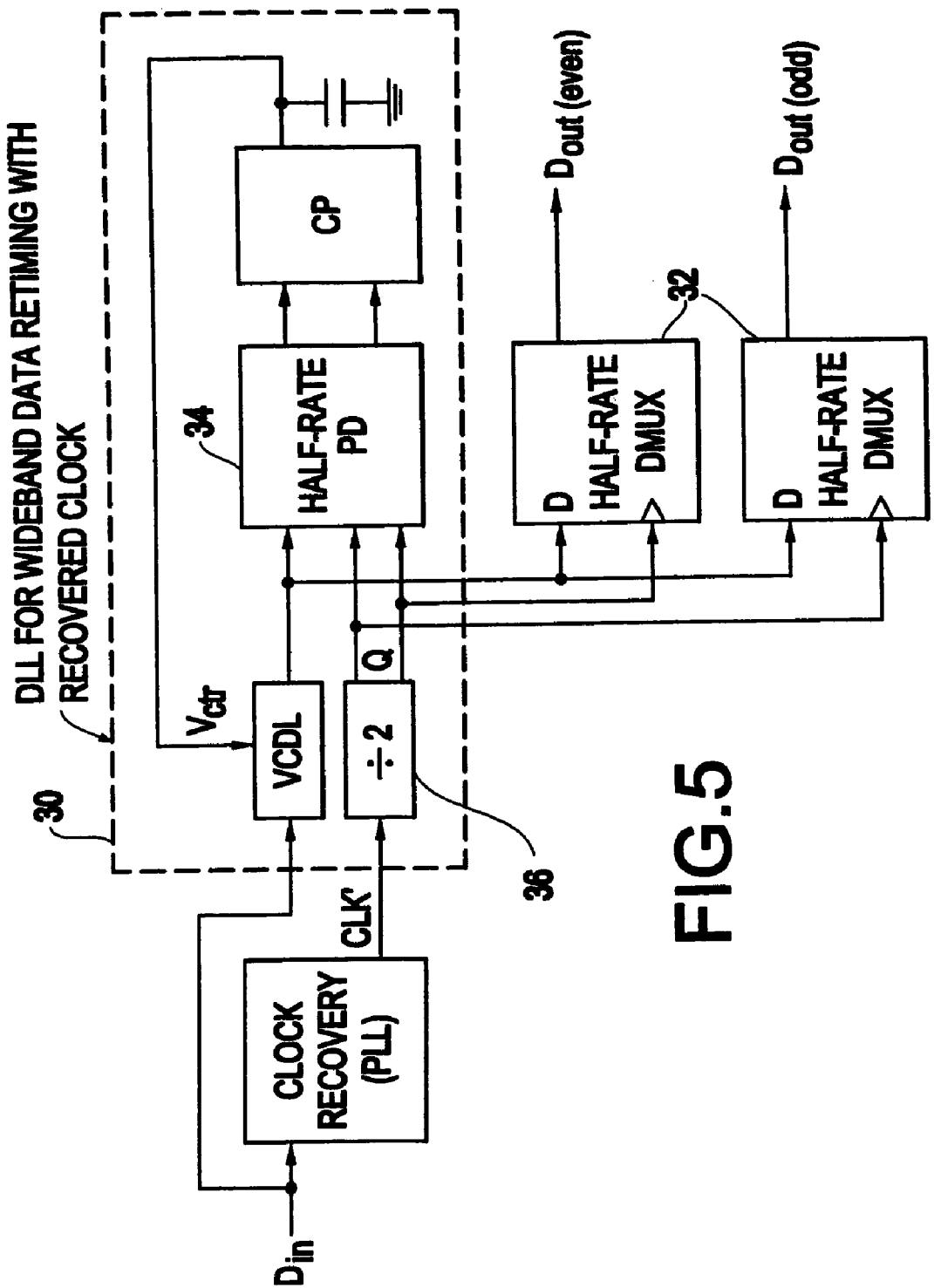
FIG. 5 is a block diagram of a third exemplary, embodiment of a clock-and-data recovery circuit in accordance with the present invention for a half-rate demultiplexer.

FIG. 5 shows a block diagram of a third exemplary embodiment of the clock-and-data recovery system in accordance with the present invention for half-rate demultiplexers. When a divide-by-2 circuit is necessary for the half-rate demultiplexers 32, the delay-locked loop 30 with a half-rate phase detector 34 can also perform delay compensation for the divide-by-2 circuit 36. In FIG. 5. an in-phase signal (I) and a quadrature phase signal (Q) are generated from the divide-by-2 circuit 36 to support half-rate phase detection. Since both rising and falling edges of the clock signal are aligned to the data in the half-rate demultiplexer scheme, a quadrature phase (Q) is needed to sample the data as shown in FIG. 5.

Figure 6A:
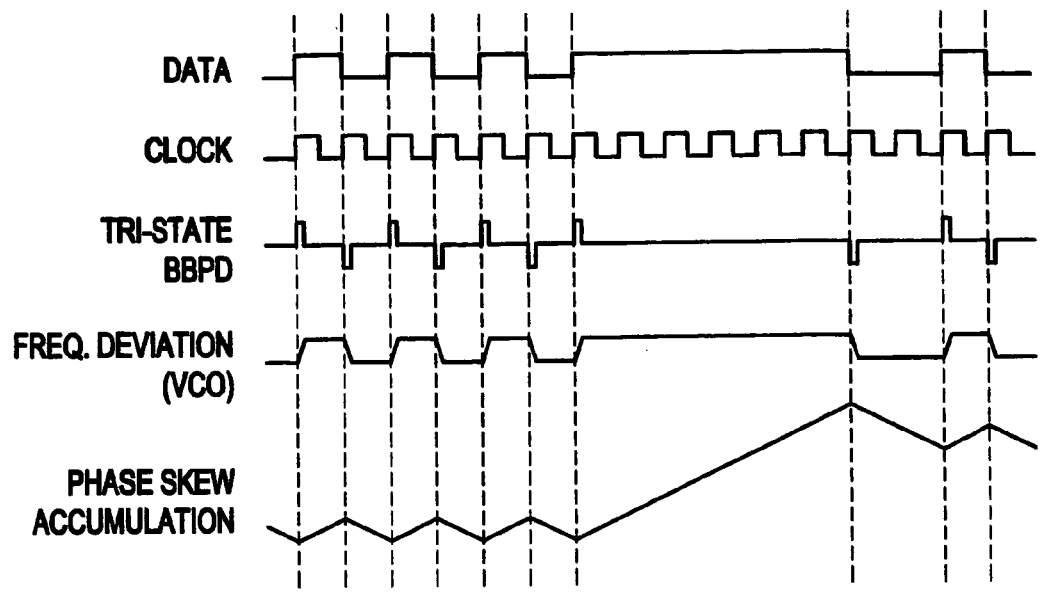
FIG. 6a shows data-pattern-dependent bang-bang phase detection phase-locked loop for a delay-locked loop in accordance with a third exemplary embodiment of a clock-and-data recovery circuit of the present invention.
Figure 6B:
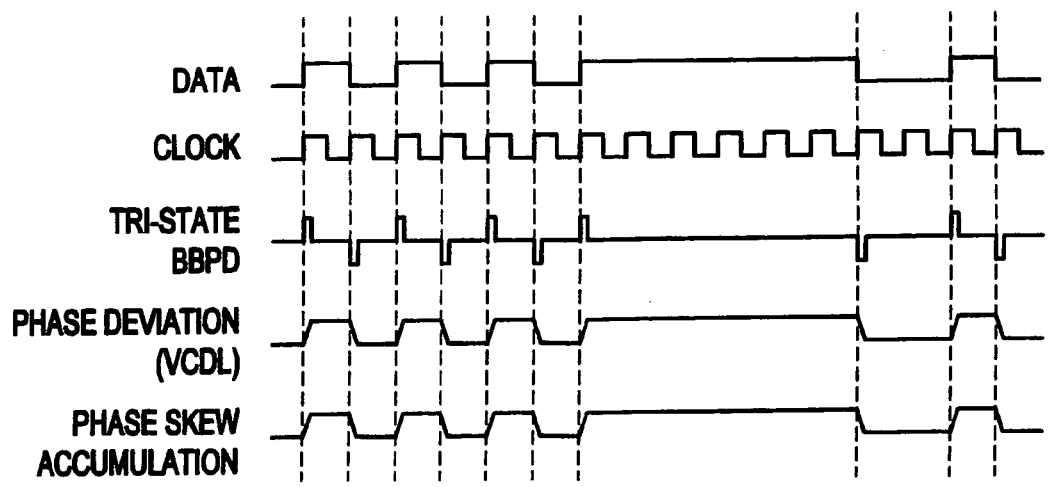
FIG. 6b shows data-pattern-independent bang-bang phase detection phase-locked loop for a delay-locked loop in accordance with a third exemplary embodiment of a clock-and-data recovery circuit of the present invention.

The present invention also offers data-pattern-independent bang-bang phase detection when binary phase detectors are used. A conventional bang-bang phase detector (BBPD) generates an error voltage to control the voltage-controlled oscillator, resulting in frequency deviation for each cycle. FIGS. 6a and 6b show simplified diagrams of a bang-bang phase detection with a phase-locked loop, and with a delay-locked loop. Controlling frequency causes time-dependent phase skew due to phase accumulation as illustrated in FIG. 6a, which makes the clock-and-data recovery performance depend on the data pattern. The present invention produces phase deviation rather than frequency deviation, so that phase accumulation does not occur even for long absence of data transition. The phase accumulation by the clock-recovery phase-locked loop is not a concern in data retiming since it is tracked by a delay-locked loop having a much wider bandwidth.

Fourth Exemplary Embodiment

Figure 7:
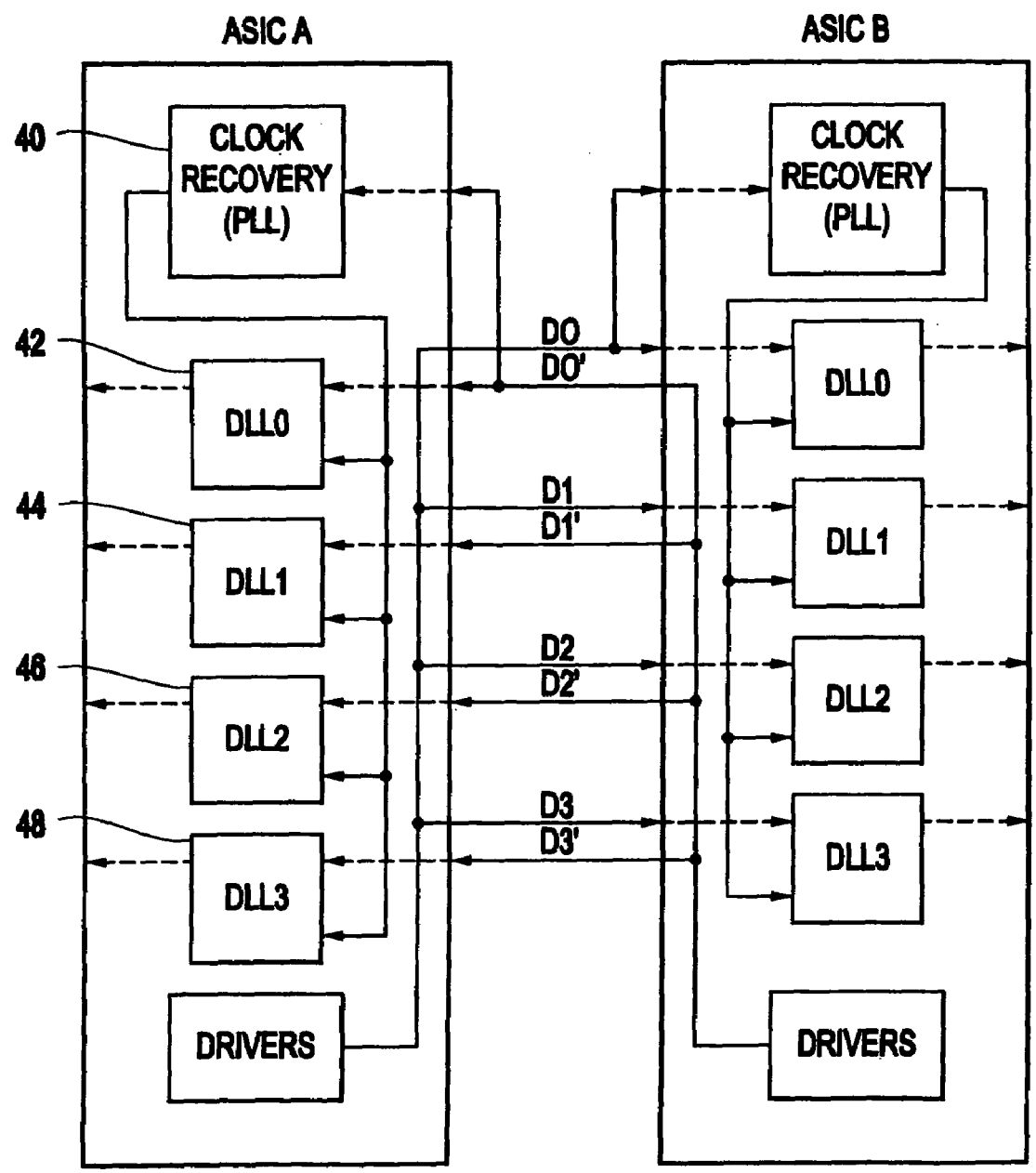
FIG. 7 is a block diagram of a fourth exemplary embodiment of a clock-and-data recovery circuit in accordance with the present invention for parallel link data communications.

A fourth exemplary embodiment of a clock-and-data recovery circuit in accordance with the present invention, shown in FIG. 7 which provides parallel link data communications without using multiple voltage-controlled oscillators.

As shown in FIG. 7, one phase-locked loop 40 provides the clock recovery, and four delay-locked loops 42, 44, 46 and 48, perform data retiming for four different data channels. Compared to having four clock-and-data recovery circuits, the topology shown in FIG. 7 requires only a single voltage-controlled oscillator instead of four voltage-controlled oscillators as would be demanded by a four-clock-and-data recovery circuit approach. Reducing the number of on-chip voltage-controlled oscillators is particularly beneficial because voltage-controlled oscillators are very sensitive to noise coupling and crosstalk, which may result in consuming more area for isolation.

Compared to methods using a phase rotator, the present invention does not employ multiphase operation, which results in better deterministic jitter (DJ) performance. Improved DJ performance can relax the random jitter performance target of the clock-and-data-recovery system, making the overall clock-and-data-recovery circuit design easier. The present invention does not require a reference clock input since the clock is extracted from the data. It is also noted that the input of the phase rotator should be the clock to achieve round-robin operation, which results in a lowpass filter jitter transfer function to the data. As a result, the loop bandwidth may not be as wide as that of the present invention.

While the invention has been described in terms of several exemplary embodiments, those skilled in the art will recognize that the invention can be practiced with modification within the spirit and scope of the appended claims.

What is claimed is:

1. A clock and data recovery circuit comprising:
   a delay-locked-loop adapted to recover data from a data stream and to track short term jitter; and
   a phase-locked-loop in communication with said delay-locked-loop and adapted to recover a clock signal from said data stream and to track long term jitter, wherein the bandwidth of the phase-locked-loop is optimized to provide a clean clock signal and wherein the bandwidth of the delay-locked-loop is optimized to provide prompt litter tracking without creating jitter peaking.

2. The circuit of claim 1, wherein said the delay-locked-loop has a wider bandwidth than said phase-locked-loop.

3. The circuit of claim 1, wherein said delay-locked-loop comprises a self-calibrating voltage-controlled delay line.

4. The circuit of claim 3, wherein said voltage-controlled delay line receives the data stream.

5. The circuit of claim 3, wherein said voltage-controlled delay line receives a recovered clock signal from said phase-locked-loop.

6. The circuit of claim 1, further comprising a D-type flip flop in communication with said delay-locked-loop.

7. The circuit of claim 1, further comprising a 1/nth-rate demultiplexer.

8. The circuit of claim 7, wherein the 1/nth-rate demultiplexer comprises a half-rate demultiplexer.

9. The circuit of claim 7, wherein the 1/nth-rate demultiplexer comprises a quarter-rate demultiplexer.

10. The circuit of claim 1, wherein said delay-locked-loop comprises a phase detector.

11. The circuit of claim 10, wherein said phase detector comprises a binary phase detector.

12. The circuit of claim 10, wherein said phase detector comprises a half-rate phase detector.

13. The circuit of claim 1, wherein said delay-locked-loop comprises a charge pump.

14. The circuit of claim 1, wherein said delay-locked-loop comprises a divider.

15. The circuit of claim 1, further comprising another delay-locked-loop in communication with said phase-locked-loop.

16. A circuit for recovering clock and data signals from a data stream, comprising:
    means for extracting a clock signal from said data stream; and
    means for extracting data from said data stream, wherein said means for extracting said clock signal and said means for extracting data are independent to optimally allocate bandwidth, and wherein said means for extracting said clock signal tracks short term jitter and said means for extracting data tracks long term jitter, wherein the bandwidth of the means for extracting the clock signal is optimized to provide a clean clock signal and wherein the bandwidth of the means for extracting data is optimized to provide prompt jitter tracking without creating jitter peaking.

17. A method of recovering clock and data signals from a data stream, comprising:
    recovering a clock signal from a data stream in a phase-locked-loop that tracks long term jitter; and
    recovering data from said data stream in a delay-locked-loop that tracks short term jitter, wherein the bandwidth of the phase-locked-loop is optimized to provide a clean clock signal and wherein the bandwidth of the delay-locked-loop is optimized to provide prompt jitter tracking without creating jitter peaking.

18. A circuit for recovering clock and data signals from a data stream, comprising:
    means for recovering a clock signal from a data stream in a phase-locked-loop that tracks long term jitter; and
    means for recovering data from said data stream in a delay-locked-loop that tracks short term jitter, wherein the bandwidth of the phase-locked-loop is optimized to provide a clean clock signal and wherein the bandwidth of the delay-locked-loop is optimized to provide prompt jitter tracking without creating jitter peaking.

* * * * *